(12) United States Patent
Lin et al.

(10) Patent No.: US 7,283,362 B2
(45) Date of Patent: Oct. 16, 2007

(54) HEAT DISSIPATION DEVICE HAVING A LOCKING DEVICE

(75) Inventors: Yu-Chen Lin, Guangdong (CN); Feng Chen, Guangdong (CN)

(73) Assignees: Hong Fu Jin Precision Industry (Shen Zhen) Co., Ltd., Longhua Town, Bao an District, Shenzhen, Guangdong Province (CN); Hon Hai Precision Industry Co., Ltd., Tu-Chung, Taipei Hsien (TW)

( * ) Notice: Subject to any disclaimer, the term of this patent is extended or adjusted under 35 U.S.C. 154(b) by 52 days.

(21) Appl. No.: 11/306,369

(22) Filed: Dec. 26, 2005

(65) Prior Publication Data

US 2007/0146999 A1 Jun. 28, 2007

(51) Int. Cl.
*H05K 7/20* (2006.01)

(52) U.S. Cl. ...................................... 361/704
(58) Field of Classification Search ................ 361/697, 361/704, 719; 439/140, 157, 159, 485, 487; 257/717; 165/80.3
See application file for complete search history.

(56) References Cited

U.S. PATENT DOCUMENTS

| | | | |
|---|---|---|---|
| 4,745,456 A | 5/1988 | Clemens | |
| 6,112,378 A * | 9/2000 | Lee | 24/458 |
| 6,243,267 B1 * | 6/2001 | Chuang | 361/704 |
| 6,449,154 B1 * | 9/2002 | Yoneyama et al. | 361/704 |
| 6,452,803 B1 | 9/2002 | Liu | |
| 6,473,306 B2 * | 10/2002 | Koseki et al. | 361/704 |
| 6,525,941 B1 * | 2/2003 | Lai | 361/697 |
| 6,640,882 B2 | 11/2003 | Dowdy et al. | |
| 7,044,197 B2 * | 5/2006 | Lee et al. | 165/80.3 |
| 7,046,516 B2 * | 5/2006 | Lee et al. | 361/704 |
| 7,142,422 B2 * | 11/2006 | Lee et al. | 361/695 |
| 7,142,430 B2 * | 11/2006 | Lee et al. | 361/719 |
| 7,175,449 B2 * | 2/2007 | Lai | 439/140 |
| 2005/0111193 A1 * | 5/2005 | Lee et al. | 361/704 |
| 2005/0117306 A1 * | 6/2005 | Lee et al. | 361/719 |
| 2006/0018097 A1 * | 1/2006 | Lee et al. | 361/704 |
| 2006/0042783 A1 * | 3/2006 | Hsu | 165/80.3 |
| 2006/0056152 A1 * | 3/2006 | Li et al. | 361/697 |
| 2006/0079104 A1 * | 4/2006 | Lai | 439/71 |
| 2006/0133038 A1 * | 6/2006 | Yu et al. | 361/697 |
| 2006/0291169 A1 * | 12/2006 | Lee et al. | 361/704 |

* cited by examiner

*Primary Examiner*—Chandrika Prasad
(74) *Attorney, Agent, or Firm*—Winston Hsu

(57) ABSTRACT

A heat dissipation device includes a retention module, a heat sink, a locking plate and a clip rotatably connecting with the retention module. The retention module includes an opening in a center thereof. The heat sink includes a heat conducting body and plurality of fins radially extending from the heat conducting body. The heat conducting body has a bottom portion received in the opening of the retention module. The locking plate engages with the bottom portion of the heat conducting body of the heat sink. The locking plate has a first portion abutting a bottom of the retention module, and a second portion opposite to the first portion. The second portion is pressed by a pressing portion of the clip when the heat dissipation device is at a locked position.

20 Claims, 7 Drawing Sheets

HEAT DISSIPATION DEVICE HAVING A LOCKING DEVICE

FIELD OF THE INVENTION

The present invention relates generally to a heat dissipation device, and more particularly to a heat dissipation device incorporating a locking device for securing the heat dissipation device to a heat-generating electronic device.

DESCRIPTION OF RELATED ART

With advancement of computer technology, electronic devices operate rapidly. It is well known that the more rapidly the electronic devices operate, the more heat they generate. If the heat is not dissipated duly, the stability of the operation of the electronic devices will be impacted severely. Generally, in order to ensure the electronic device to run normally, a heat dissipation device is used to dissipate the heat generated by the electronic device. And in order to keep the heat dissipation device intimately contacting the electronic device, a locking device is usually desired for the heat dissipation device to secure the heat dissipation device to the electronic device.

Nowadays, numerous locking devices are used to secure the heat dissipation devices to the electronic devices. Typically, a locking device comprising a strip-shaped clip and a retention module is used widely. The clip is formed by stamping a metal sheet and has two ends thereof forming two locking portions respectively. The retention module located around the electronic device. The retention module comprises retaining members for engaging with the locking portions of the clip. In use, the clip spans in a groove defined in a heat sink of the heat dissipation device resting on the electronic device. The locking portions of the clip are engaged with the retaining members of the retention module. Here, the clip is deformed and presses the heat sink to contact with the electronic device. However, during the attachment of the heat sink to the electronic device, it is considerably laborious to overcome the rigidity of the clip in order to engage the locking portion with the retaining member of the retention module. So, it is inconvenient during the assembling operation for the heat sink and the electronic device.

What is needed, therefore, is a heat dissipation device incorporating a locking device which can secure the heat dissipation device to a heat generated electronic device conveniently.

SUMMARY OF INVENTION

A heat dissipation device comprises a retention module, a heat sink, a locking plate and a clip. The retention module comprises four beams and an opening in a center thereof. The heat sink comprises a heat conducting body and a fin unit comprising a plurality of fins radially outwardly extending from the heat conducting body for dissipating heat from the heat conducting body. The heat conducting body has a bottom portion for thermally connecting with a heat-generating electronic component. The bottom portion of the heat conducting body is received in the opening of the retention module. The locking plate engages with the bottom portion of the heat conducting body of the heat sink. The locking plate has a first portion abutting a bottom of one of the beams of the retention module, and a second portion extending opposite to the first portion thereof. The clip rotatably connects with the retention module. The clip comprises a pressing portion pressing the second portion of the locking plate when the heat dissipation device is at a locked position.

Other advantages and novel features will become more apparent from the following detailed description of preferred embodiments when taken in conjunction with the accompanying drawings, in which:

DETAILED DESCRIPTION

Figure 1:
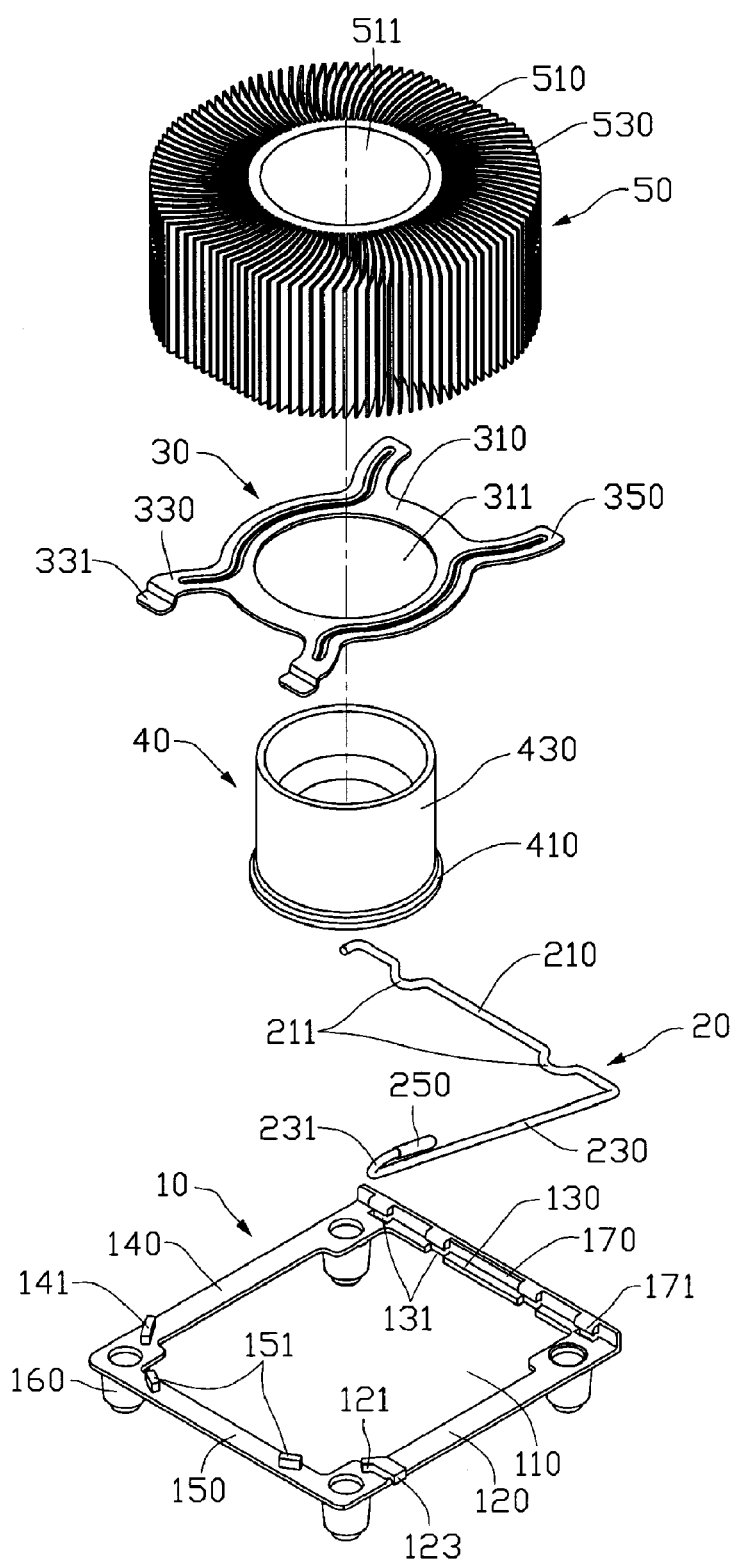
FIG. 1 is an exploded, isometric view of a heat dissipation device in accordance with a preferred embodiment of the present invention.

Referring to FIG. 1, a heat dissipation device in accordance with a preferred embodiment of the present invention is shown. The heat dissipation device comprises a heat sink which comprises a fin unit 50 and a column 40 received in the fin unit 50, a locking plate 30 combined to the column 40 of the heat sink, a clip 20 and a retention module 10 cooperating with the locking plate 30 to secure the heat sink to a heat generating electronic device (not show) located on a printed circuit board (not show).

The retention module 10 which is a substantially rectangular frame, is located on the printed circuit board and surrounds the electronic device. The retention module 10 comprises an opening 110 defined therein for receiving the electronic device when the retention module 10 is mounted to the printed circuit board. The retention module 10 includes interconnected first, second, third and fourth beams 120, 130, 140, 150 around the opening 110. Four legs 160 respectively depend from four corners of a bottom of the retention module 10 for fixing the retention module 10 to the printed circuit board. A short sidewall 170 extends upwardly from an outmost side of the second beam 130 of the retention module 10. Four locating hooks 171 extend from a top of the sidewall 170 toward the opening 110, for locating the clip 20 to the retention module 10. Corresponding to the locating hooks 171 of the sidewall 170, the second beam 130 has four gaps 131 defined therein. At joints of the third, fourth and first beams 140, 150, 120 of the retention module 10, blocks 141, 151, 121 extend upwardly from the beams 140, 150, 120. The blocks 141, 151, 121 face toward the opening 110 for blocking the fin unit 50 of the heat sink when the heat dissipation device in accordance with the present invention is assembled. The block 121 has a portion extending outwardly beyond an outer side of the first beam 120 to thereby forming a locking ear 123 for locking the clip 20 to the retention module 10.

The clip 20 which is substantially L-shaped, is formed by bending a wire having a high strength. The clip 20 comprises a connecting portion 210 and an operating portion 230 extending from an end of the connecting portion 210. The connecting portion 210 has two spaced pressing portions 211 protruding toward the opening 110 of the retention module 10. The operating portion 230 has a distal end thereof bent to form a handle portion 231 for facilitating a user to manipulate the clip 20. A plastic sleeve 250 is used to cover a free end of the handle portion 231 whereby the user can more easily grip the handle potion 231.

The locking plate 30 comprises a substantially circular body 310 and a pair of spaced first legs 330 and a pair of spaced second legs 350 extending outwardly from the body 310 in substantially opposite directions. A through hole 311 is defined in a center of the body 310 for receiving the column 40 of the heat sink therein. Each of the first legs 330 has a distal end thereof stepped downwardly to form a toe 331.

The column 40 has a high heat conductivity, and comprises an expanding circular bottom portion 410 and a cylinder 430 extending upwardly from the bottom portion 410. The cylinder 430 defines a hollow in an upper portion thereof.

The fin unit 50 is substantially cylindrical, and comprises a cylindrical core 510 and a plurality of fins 530 extending radially outwards from the core 510. The core 510 defines a vertical through hole 511 therethrough for receiving the column 40 therein. The fins 530 radially extend from an outer face of the core 510. All of the fins 530 curve along a circumferential direction of the core 510.

Figure 2:
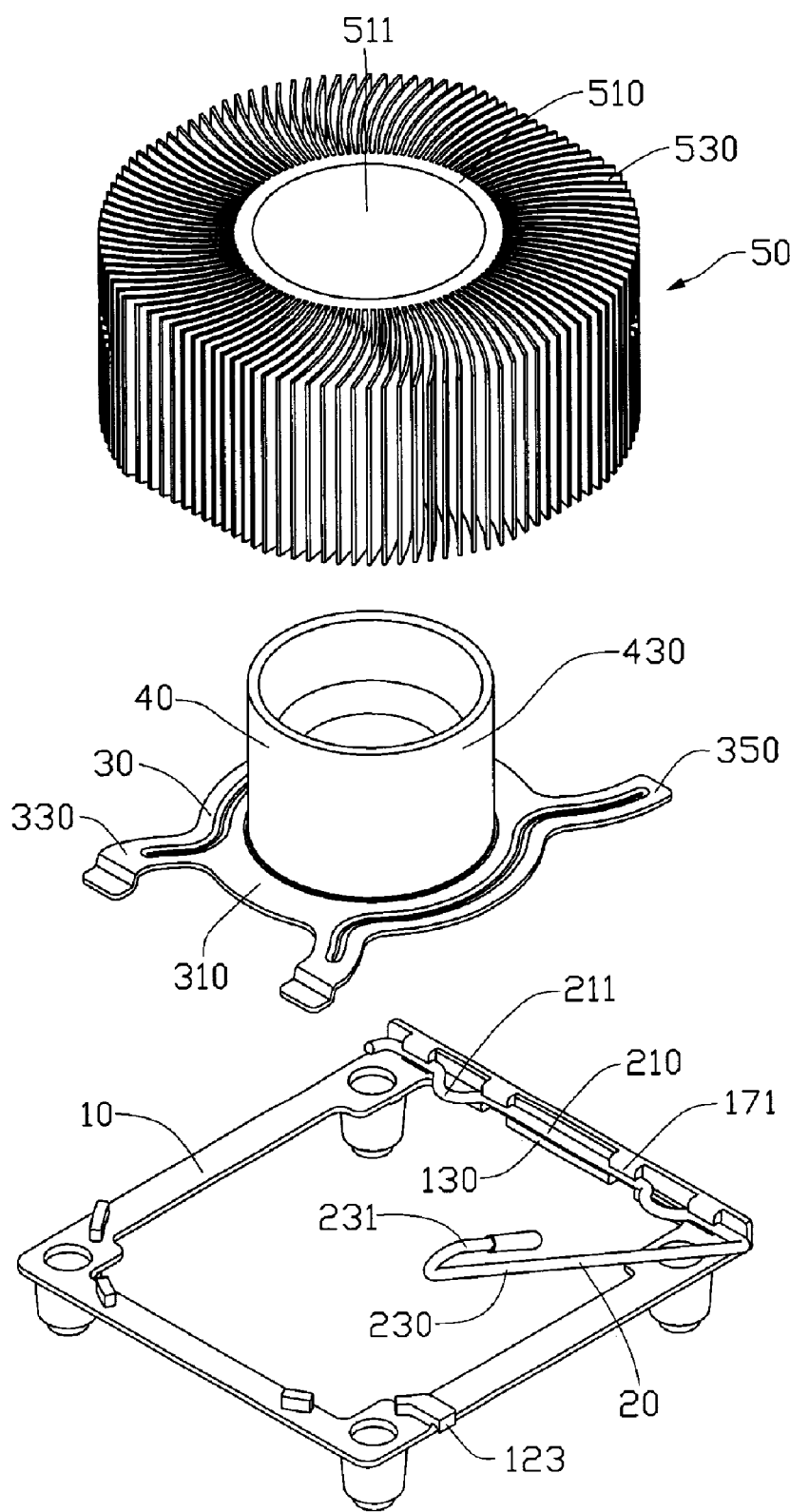
FIG. 2 is a partially assembled view of FIG. 1.

Referring to FIG. 2, in assembly of the clip 20 and the retention module 10, the connecting portion 210 of the clip 20 is rotatably positioned between the second beam 130 and the locating hooks 171 of the sidewall 170, and each pressing portion 211 of the connecting portion 210 is between two locating hooks 171.

Figure 3:
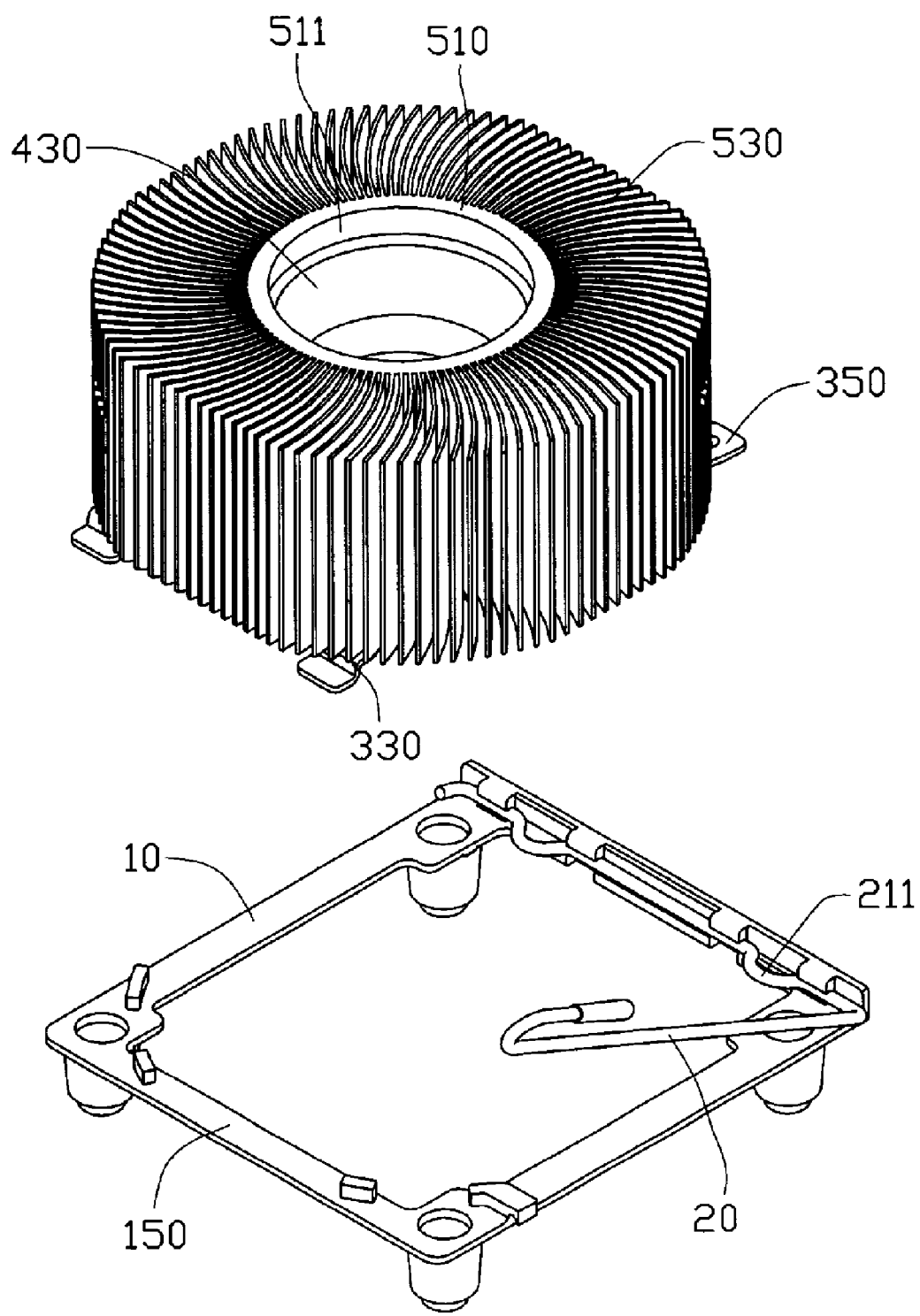
FIG. 3 is a further partially assembled view of FIG. 2.

Referring also to FIG. 3, in assembly of the locking plate 30 and the heat sink, the locking plate 30 is first assembled to the column 40 of the heat sink by fitting the cylinder 430 of the column 40 into the hole 311 of the locking plate 30 until a top face (not labeled) of the bottom portion 410 of the column 40 abuts the locking plate 30. The cylinder 430 has an interferential engagement with the circular body 310 so that the column 40 and the locking plate 30 are securely connected together. Thereafter, the fin unit 50 is assembled to the column 40 by interferentially fitting the cylinder 430 of the column 40 in the through hole 511 of the core 510 of the fin unit 50 of the heat sink. The fin unit 50 rests on the locking plate 30. The interferential engagement between the fin unit 50 and the cylinder 430 can be achieved by firstly heating the fin unit 50 to expand the through hole 511. The cylinder 430 is inserted into the through hole 511 under the expanded condition. When the fin unit 50 is cooled, the core 510 shrinks to have an interferential engagement with the cylinder 430 so that the column 40 and the fin unit 50 are securely connected together. In addition, the column 40 and the fin unit 50 are thermally connected together so that heat absorbed by the column 40 is rapidly transferred to the fin unit 50.

Figure 4:
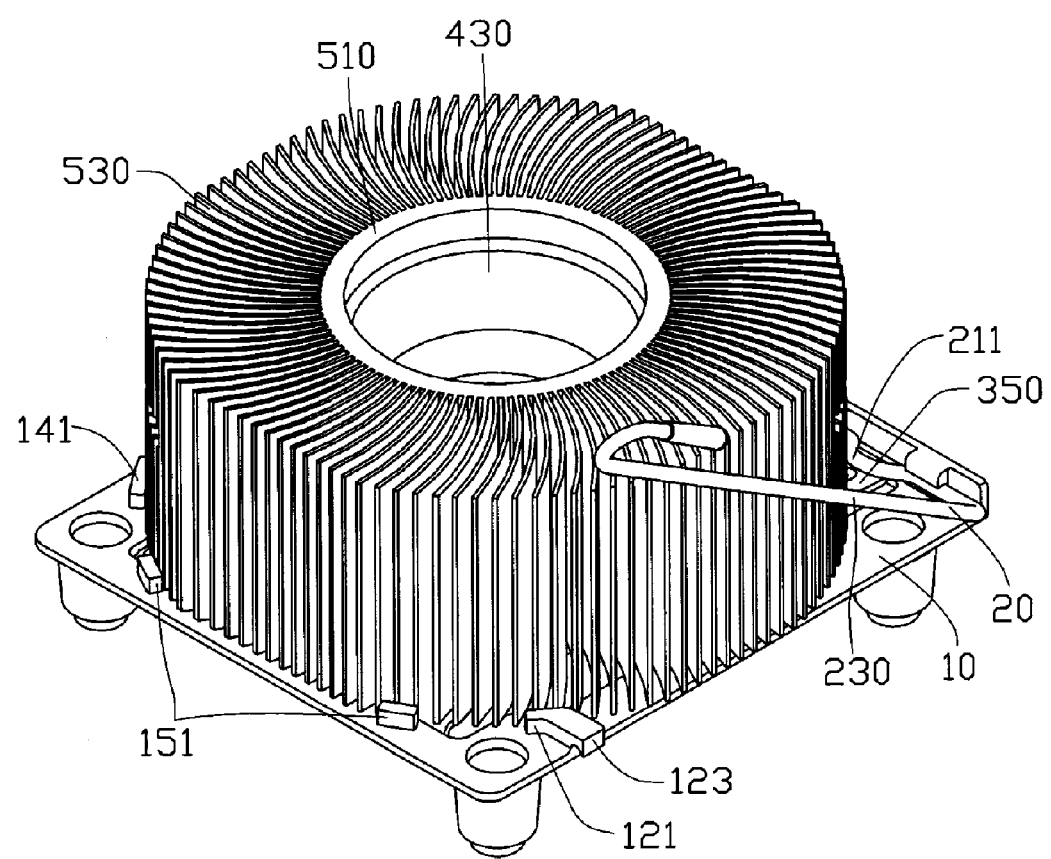
FIG. 4 is an assembled view of FIG. 1 with a clip at an unlocked position.
Figure 5:
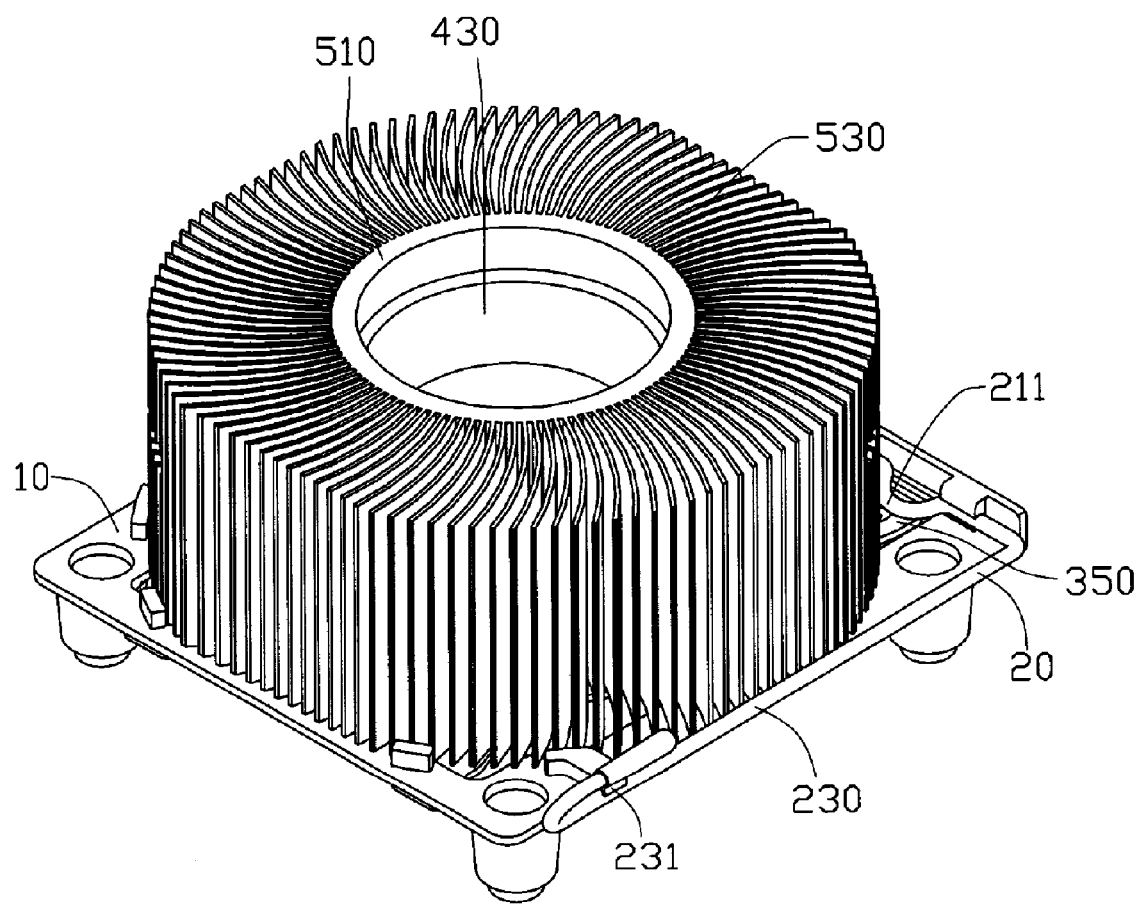
FIG. 5 is an assembled view of FIG. 1 with a clip at a locked position.
Figure 6:
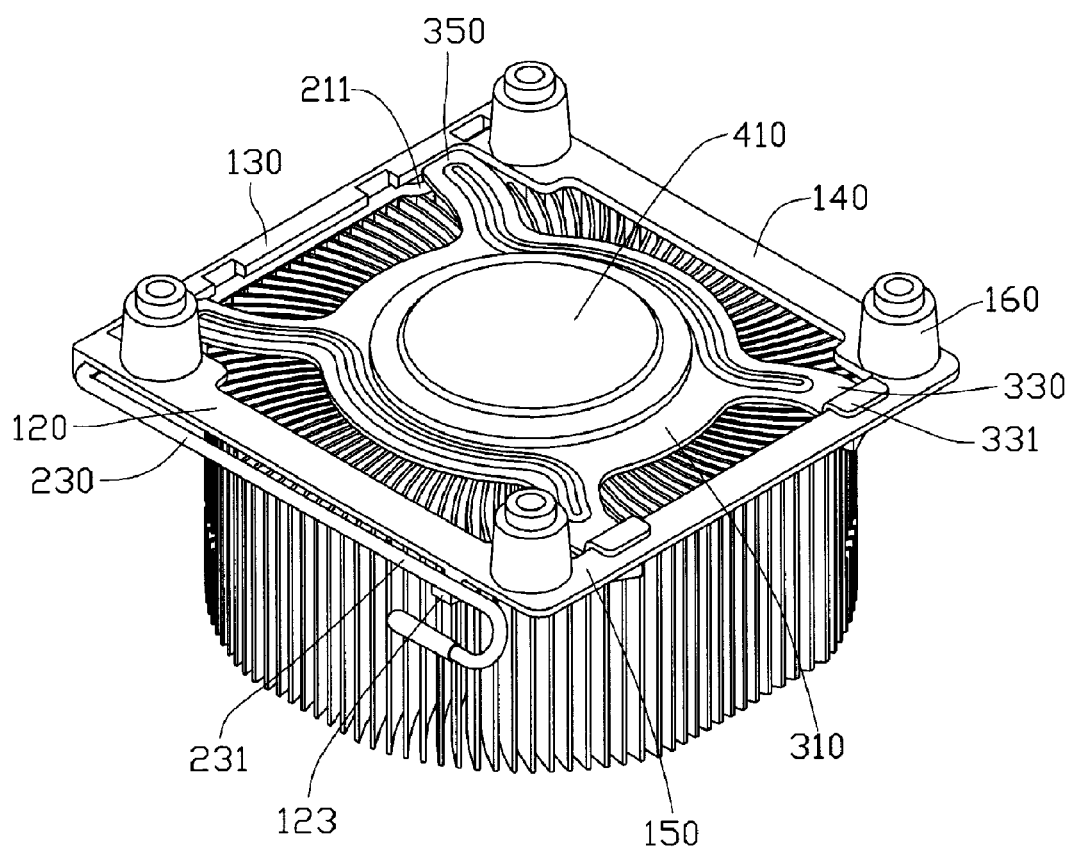
FIG. 6 is an inverted view of FIG. 5.

Referring to FIGS. 4-6, in assembly, the locking plate 30 and the bottom portion 410 of the column 40 of the heat sink is inserted into the opening 110 of the retention module 10 at a position wherein the toes 311 of the two first legs 330 of the locking plate 30 abut against a bottom of the fourth beam 150 of the retention module 10. The two second legs 350 are received in the opening 110 of the retention module 10 and located under the pressing portions 211 of the clip 20, respectively. The blocks 141, 151, 121 of the retention module 10 block an outmost side of the fin unit 50 of the heat sink. Here, particularly seeing FIG. 4, the heat dissipation device is in an unlocked position. To lock the heat dissipation device, the operating portion 230 of the clip 20 is then rotated downwardly to a position in which a part of the operating portion 230 of the clip 20 near the handle portion 231 locks with the locking ear 123 of the retention module 10. By this, the pressing portions 211 of the clip 20 press the two second legs 350 of the locking plate 30 downwardly, respectively. Here, particularly seeing FIGS. 5 and 6, the heat dissipation device is in a locked position. The heat dissipation device is secured to the electronic device with the bottom portion 410 of the column 40 intimately contacting the electronic device.

Inversely, when it comes to disassemble the heat sink from the electronic device, the lock between the operating portion 230 of the clip 20 and the locking ear 123 is firstly released by manipulating the handle portion 231 of the operating portion 230 of the clip 20 to motivate the operation portion 230 away from the locking ear 123. The operation portion 230 is rotated upwardly to the position as shown in FIG. 4; thus, the downwardly pressing force acting on the two second legs 350 by the pressing portions 211 is released, and the locking plate 30 can be detached from the retention module 10. Accordingly, the heat sink can be removed from the electronic device.

According to the preferred embodiment of the present invention, the locking plate 30 engages with the heat sink. In assembly, the locking plate 30 has the two first locking legs 330 thereof abutting the retention module 10 and the two second legs 350 being pressed under the pressing portions 211 of the clip 20. The clip 20 rotatably connects with the retention module 10; therefore, the heat dissipation device can get to the locked position or unlocked position via operating the operating portion 230 of the clip 20. Thus, it is convenient to secure/detach the heat sink to/from the electronic device.

Figure 7:
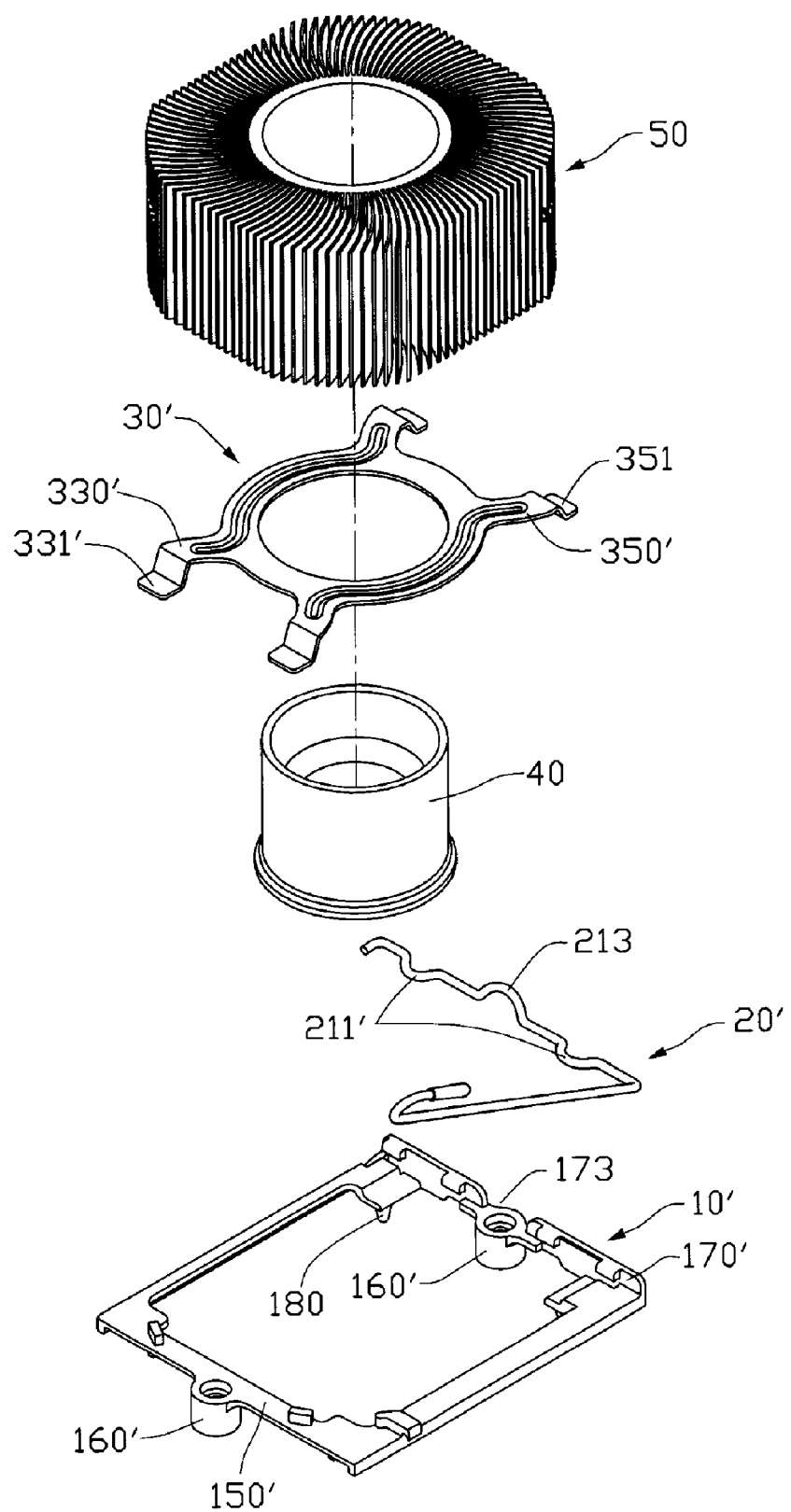
FIG. 7 is an exploded view of a heat dissipation device of an alternative embodiment of the present invention.

Referring to FIG. 7, a heat dissipation device in accordance with an alternative embodiment of the present invention is shown. The heat dissipation device is similar to the heat dissipation device of the preferred embodiment, but what is main different is that a retention module 10' of the heat dissipation device has two legs 160' depending from centers of a fourth beam 150' and a sidewall 170' opposite to the fourth beam 150', respectively, for securing the heat dissipation device to the printed circuit board. Four feet 180 depend from four corners of the bottom of the retention module 10'. The sidewall 170' defines a concave 173 above the leg 160'. A clip 20' has a bend 213 formed between two pressing portions 211' and corresponding to the concave 173 of the sidewall 170'. The bent 213 is substantially perpendicular to pressing portions 211'. A locking plate 30' has two first legs 330' thereof and two second legs 350' thereof stepped downwardly to form toes 331', 351 at distal ends thereof. In assembly, the toes 351 abut against a bottom of the sidewall 170'. The bend 213 is devised that when the clip 20' is rotated, the clip 20' will not have an interference with the leg 160' on the sidewall 170'.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink comprising a heat conducing body and a fin unit thermally combined to the heat conducting body;
   a locking plate engaging with the heat conducting body of the heat sink, the locking plate having a first portion and a second portion located at a circumference of the heat conducting body of the heat sink;

a retention module comprising a bottom and an opening defined therein; and a clip rotatably connecting with the retention module, the clip comprising a pressing portion;

wherein the first portion of the locking plate has a portion thereof extending downwardly through the opening of the retention module and abuts the bottom of the retention module and the second portion of the locking plate is pressed under the pressing portion of the clip when the heat dissipation device is at a locked position.

2. The heat dissipation device of claim 1, wherein the retention module has a sidewall extending from the retention module, the sidewall extending a plurality of locating hooks toward the opening of the retention module, and wherein the clip comprises a connecting portion rotatably positioned under the locating hooks.

3. The heat dissipation device of claim 2, wherein a plurality of spaced blocks extends from the retention module and is located opposite to the sidewall, the blocks abutting the fin unit of the heat sink to keep the heat sink between the sidewall and the blocks.

4. The heat dissipation device of claim 2, wherein the pressing portion of the clip is bent from the connecting portion toward the opening of the retention module.

5. The heat dissipation device of claim 2, wherein the clip comprises an operating portion extending from an end of the connecting portion, and wherein the retention module has an locking ear, a distal end of the operating portion of the clip engaged with the locking ear of the retention module when the heat dissipation device is at the locked position.

6. The heat dissipation device of claim 1, wherein the fin unit of the heat sink rests on the locking plate.

7. The heat dissipation device of claim 1, wherein the heat conducting body of the heat sink comprises an expanding bottom and a cylinder extending from the bottom, and wherein the locking plate has a body defining a hole therein, the cylinder being fitted in the hole of the locking plate, the locking plate resting on the bottom of the locking plate.

8. The heat dissipation device of claim 7, wherein the fin unit of the heat sink comprises a cylindrical core with a through hole defined in a center thereof, and a plurality of fins radially extending from the core, and wherein the cylinder of the heat conducting body is fitted in the through hole of the core and thermally connects with the core, each of the fins being curved along a circumferential direction of the core.

9. The heat dissipation device of claim 1, wherein the first portion of the locking plate has two first legs extending from a side of the body, and wherein the retention module comprises four interconnecting beams surrounding the opening of the retention module, the first legs having distal ends thereof abutting the bottom of one of the beams.

10. The heat dissipation device of claim 9, wherein the second portion of the locking plate has two second legs extending from another side of the body opposite the first legs, and wherein the clip comprises an additional pressing portion, the two pressing portions of the clip respectively pressing the two second legs of locking plate.

11. A heat dissipation device comprising:
a retention module comprising a bottom and an opening defining in a center thereof;
a heat sink comprising a heat conducting body and a fin unit comprising a plurality of fins radially around the heat conducting body for dissipating heat from the heat conducting body, the heat conducting body having a bottom portion received in the opening of the retention module;
a locking plate engaging with the bottom portion of the heat conducting body of the heat sink, the locking plate having a first portion thereof extending downwardly through the opening to abut the bottom of the retention module, and a second portion opposite to the first portion; and
a clip rotatably connecting with the retention module, the clip comprising a pressing portion pressing the second portion of the locking plate when the heat dissipation device is at a locked position.

12. The heat dissipation device of claim 11, wherein a sidewall extends upwardly from the retention module, the sidewall having a plurality of locating hooks extending from a top of the sidewall towards the opening of the retention module.

13. The heat dissipation device of claim 12, wherein the clip comprises a connecting portion positioned between the locating hooks and the retention module, and an operating portion extending from an end of the connecting portion.

14. The heat dissipation device of claim 13, wherein the retention module has a plurality of blocks facing toward the opening thereof, the blocks abutting the fins of the heat sink.

15. The heat dissipation device of claim 11, wherein the locking plate comprises a circular body defining a hole therein, the first portion and the second portion oppositely extending outwardly from the body.

16. A heat dissipation device comprising:
a retention module having a central opening adapted for accommodating a heat-generating electronic component mounted on a printed circuit board;
a heat sink mounted on the retention module, comprising:
a column having a bottom portion adapted for thermally contacting with the electronic component;
a locking plate having a circular body through which the column extends, a first leg extending in a first direction to extend downwardly through the opening and abut against the retention module and a second leg extending in a second direction substantially opposite the first direction;
a fin unit having a core through the column extends, a plurality of fins raidally outwardly extending from the core, wherein the locking plate is located between the fin unit and the bottom portion of the column;
a clip rotatably mounted to the retention module between locked and unlocked positions, at the locked position, the clip downwardly pressing the second leg of the locking plate.

17. The heat dissipation device of claim 16, wherein the first leg forms a step near a free end thereof and a toe at the free end thereof, the toe engaging a bottom of the retention module.

18. The heat dissipation device of claim 17, wherein the retention module forms a plurality of spaced blocks on a top thereof, the blocks abutting an outer periphery of the fins.

19. The heat dissipation device of claim 17, wherein the second leg forms a step near a free end thereof and a toe at the free end thereof, the toe of the second leg engaging the bottom of the retention module.

20. The heat dissipation device of claim 17, wherein the clip is substantially L-shaped with a connecting portion rotatably connected to the retention module and an operation portion for manipulating the clip, the connecting portion forming a pressing portion protruding towards the opening, the pressing portion pressing downwardly the second leg of the locking plate when the clip is at the locked position.

* * * * *